(12) United States Patent
Deng et al.

(10) Patent No.: US 10,945,342 B2
(45) Date of Patent: Mar. 9, 2021

(54) FASTENING ASSEMBLY, HOLDING MECHANISM, BRACKET AND REMOTE CONTROLLER, USING THE HOLDING MECHANISM

(71) Applicant: SZ DJI TECHNOLOGY CO., LTD., Shenzhen (CN)

(72) Inventors: Lei Deng, Shenzhen (CN); Yin Tang, Shenzhen (CN); Tao Zhao, Shenzhen (CN)

(73) Assignee: SZ DJI TECHNOLOGY CO., LTD., Shenzhen (CN)

(*) Notice: Subject to any disclaimer, the term of this patent is extended or adjusted under 35 U.S.C. 154(b) by 0 days.

(21) Appl. No.: 16/573,715

(22) Filed: Sep. 17, 2019

(65) Prior Publication Data

US 2020/0015369 A1 Jan. 9, 2020

Related U.S. Application Data

(63) Continuation of application No. 16/259,661, filed on Jan. 28, 2019, now Pat. No. 10,440,843, which is a
(Continued)

(51) Int. Cl.
| | |
|---|---|
| *H05K 5/00* | (2006.01) |
| *A63H 30/04* | (2006.01) |
| *G03B 17/38* | (2021.01) |
| *G03B 15/00* | (2021.01) |
| *G03B 17/56* | (2021.01) |

(Continued)

(52) U.S. Cl.
CPC .......... *H05K 5/0017* (2013.01); *A63H 30/04* (2013.01); *F16B 2/12* (2013.01); *F16C 11/10* (2013.01); *F16M 11/041* (2013.01); *F16M 11/10* (2013.01); *F16M 13/02* (2013.01);

*F16M 13/04* (2013.01); *G03B 15/006* (2013.01); *G03B 17/38* (2013.01); *G03B 17/561* (2013.01); *H05K 5/0217* (2013.01); *H05K 7/1401* (2013.01);
(Continued)

(58) Field of Classification Search
USPC .......................................................... 361/759
See application file for complete search history.

(56) References Cited

U.S. PATENT DOCUMENTS

| | | | | |
|---|---|---|---|---|
| 5,020,407 | A * | 6/1991 | Brinlee | B21D 28/12 83/530 |
| 5,383,795 | A * | 1/1995 | Falossi | H01R 13/516 439/362 |

(Continued)

FOREIGN PATENT DOCUMENTS

| | | |
|---|---|---|
| CN | 101581870 A | 11/2009 |
| CN | 102022415 A | 4/2011 |

(Continued)

OTHER PUBLICATIONS

The World Intellectual Property Organization (WIPO) International Search Report for PCT/CN2014/092544 dated Aug. 7, 2015 8 Pages.

*Primary Examiner* — Hung S. Bui
(74) *Attorney, Agent, or Firm* — Anova Law Group, PLLC

(57) ABSTRACT

A fastening assembly includes a fastening member and an operating member movably sheathed on the fastening member. The fastening member includes a threaded part and a mating part connected to the threaded part. The operating member includes a snap-fitting part corresponding to the mating part.

17 Claims, 10 Drawing Sheets

Related U.S. Application Data continuation of application No. 15/605,387, filed on May 25, 2017, now Pat. No. 10,194,541, which is a continuation of application No. PCT/CN2014/092544, filed on Nov. 28, 2014.

(51) Int. Cl.
| | |
|---|---|
| *F16M 13/04* | (2006.01) |
| *F16M 11/10* | (2006.01) |
| *F16M 11/04* | (2006.01) |
| *F16B 2/12* | (2006.01) |
| *F16C 11/10* | (2006.01) |
| *F16M 13/02* | (2006.01) |
| *H05K 5/02* | (2006.01) |
| *H05K 7/14* | (2006.01) |
| *F16B 35/04* | (2006.01) |
| *H04N 5/232* | (2006.01) |

(52) U.S. Cl.
CPC ........ *F16B 35/042* (2013.01); *H04N 5/23203* (2013.01)

(56) References Cited

U.S. PATENT DOCUMENTS

| | | | |
|---|---|---|---|
| 6,076,978 A | 6/2000 | McIlvenna | |
| 6,364,688 B1 * | 4/2002 | Fraley, II | H01R 13/639 |
| | | | 411/353 |
| 6,816,713 B2 | 11/2004 | Chen | |
| 6,880,791 B1 * | 4/2005 | Lin | F16M 13/02 |
| | | | 248/231.61 |
| 7,158,092 B2 | 1/2007 | Shen | |
| 7,377,799 B2 * | 5/2008 | Kuo | H01R 13/6215 |
| | | | 439/339 |
| D723,558 S | 3/2015 | Downs | |
| 9,687,735 B2 | 6/2017 | Hong | |
| 10,194,541 B2 | 1/2019 | Deng et al. | |
| 2002/0167491 A1 | 11/2002 | Huang et al. | |
| 2004/0235566 A1 | 11/2004 | Hussaini et al. | |
| 2005/0236536 A1 | 10/2005 | Fan | |
| 2014/0083225 A1 | 3/2014 | Downs et al. | |
| 2014/0145051 A1 | 5/2014 | Gwag | |
| 2014/0364232 A1 | 12/2014 | Cramer et al. | |
| 2017/0176987 A1 | 6/2017 | Deng et al. | |
| 2017/0299110 A1 | 10/2017 | Peng et al. | |

FOREIGN PATENT DOCUMENTS

| | | |
|---|---|---|
| CN | 102032426 A | 4/2011 |
| CN | 102556359 A | 7/2012 |
| CN | 203736852 U | 7/2014 |
| GB | 2127164 A | 4/1984 |
| JP | 2001324748 A | 11/2001 |
| JP | 2003219257 A | 7/2004 |

* cited by examiner

FASTENING ASSEMBLY, HOLDING MECHANISM, BRACKET AND REMOTE CONTROLLER, USING THE HOLDING MECHANISM

CROSS-REFERENCE TO RELATED APPLICATIONS

This is a continuation application of U.S. application Ser. No. 16/259,661, filed on Jan. 28, 2019, which is a continuation application of U.S. application Ser. No. 15/605,387, filed on May 25, 2017, now U.S. Pat. No. 10,194,541, which is a continuation application of International Application No. PCT/CN2014/092544, filed on Nov. 28, 2014, the entire contents of all of which are incorporated herein by reference.

TECHNICAL FIELD

The present disclosure relates to a fastening assembly, a holding mechanism, as well as a bracket and a remote controller using the holding mechanism.

BACKGROUND

With the development of science and technology, aerial photography has emerged and become increasingly popular, and aerial photography with unmanned aerial vehicles is increasingly favoured by photographers because of lower costs and safety thereof in comparison with manned aerial photography. Aerial photography with unmanned aerial vehicles is usually carried out by using an aerial vehicle which carries a shooting device, such as a video camera or a photo camera, for shooting. Generally, a photographer uses a remote controller to control the flight of the aerial vehicle, and in order to watch the shooting effect in time, a displaying device such as a display and a mobile phone needs to be mounted on the remote controller, wherein the displaying device is fixed on the remote controller via a holding device. The holding device usually comprises a first and a second clamping member for clamping the displaying device and the first and second clamping members are elastically connected and movable relative to each other, such that the holding device is applicable to displaying devices such as mobile phones of different sizes.

However, the holding device is not applicable to all displaying devices in a larger size range, such as a mobile phone and a tablet, etc., and therefore the application range thereof is largely limited. Moreover, the holding device elastically clamps the displaying device via the first and second clamping members, and therefore the clamping force is small and the clamping is unreliable; and when the holding device shakes, the displaying device can easily fall off of the holding device.

SUMMARY

The present disclosure provides a holding mechanism with tight and reliable clamping and a broad application range, a bracket and a remote controller using the holding mechanism, as well as a fastening assembly for the holding mechanism.

A fastening assembly, comprising: a fastening member, with a threaded part and a mating part connected to the threaded part. The threaded part and the mating part are formed on the fastening member; and an operating member which is movably sheathed on the fastening member, with a snap-fitting part corresponding to the mating part being formed on the operating member. The operating member can slide along the axial direction thereof relative to the fastening member under the action of an external force, until the snap-fitting part is snap-fitted with the mating part, such that the operating member drives the fastening member to rotate via the snap-fitting part.

In some embodiments, the fastening assembly further comprises a resetting member which provides an elastic restoring force to the operating member to enable the operating member to automatically reset after sliding.

In some embodiments, the resetting member is accommodated in the operating member. One end of the resetting member abuts against the fastening member, and the other end thereof abuts against the operating member.

In some embodiments, a first and a second sheathing hole are provided on the operating member along the axial direction thereof. The first and second sheathing holes are in communication with each other and penetrate through the entire operating member. The size of the first sheathing hole is smaller than that of the second sheathing hole, such that a stepped surface is formed at the position where the first and second sheathing holes are connected and one end of the resetting member abuts against the stepped surface and the other end thereof abuts against the fastening member.

In some embodiments, the fastening member further comprises a flange part formed on the end of the mating part which is far away from the threaded part. The resetting member is sheathed on the mating part and abuts between the stepped surface and the flange part.

In some embodiments, the snap-fitting part is a snapping protrusion formed in the operating member. A snapping part is provided on the end of the mating part which is relatively far away from the threaded part. The operating member can slide along the axial direction relative to the fastening member, such that the snap-fitting part can be snapped with or separated from the snapping part.

In some embodiments, the snapping part is a slot provided on the mating part and extending along the circumferential direction of the mating part.

In some embodiments, the diameter of the threaded part is smaller than that of the mating part. A sliding groove is recessed on the mating part along the axial direction thereof. One end of the sliding groove penetrates to the threaded part and the other end thereof is in communication with the snapping part. The snap-fitting part can slide along the sliding groove into the snapping part.

In a fastening assembly described in any one of the above, further comprises a locking member for a threaded fit with the threaded part.

A holding mechanism, comprising a first and a second clamping member, wherein the first clamping member comprises a first clamping part; the second clamping member comprises a second clamping part and a limiting part; the second clamping member is slidably mounted on the first clamping member so as to adjust the spacing between the second clamping part and the first clamping part; the holding mechanism further comprises a limiter provided on the first clamping member, and the limiter is fitted with the limiting part so as to limit the relative sliding position of the first and second clamping members.

In some embodiments, the holding mechanism further comprises a first elastic member. One end of the first elastic member is connected to the first clamping member and the other end thereof is connected to the second clamping member, so as to provide a restoring force of movement for the relative sliding between the first and second clamping members.

In some embodiments, the first clamping member comprises a first housing and a second housing snap-fitted with the first housing, and the first clamping part and the limiter are provided on the second housing; the second clamping member is slidably accommodated between the first housing and the second housing.

In some embodiments, the limiter is rotatably provided on the second housing and the limiter can be separated from or snapped with the limiting part by pressing or releasing the limiter.

In some embodiments, the limiting part is a sawtooth rack, and the limiter is a rotating stir wheel with one end snapped with the sawtooth rack and the other end being an operating end.

In some embodiments, the holding mechanism further comprises a pressing member, the pressing member is provided on the second housing and can drive the limiter to rotate by pressing or releasing the pressing member.

In some embodiments, the holding mechanism further comprises a second elastic member for providing a restoring force of rotation to the limiter.

In some embodiments, a meshing member is rotatably provided on the first housing and a meshing part for meshing with the meshing member is provided on the second clamping member.

In some embodiments, the meshing member is a gear, the meshing part is a rack, and when the second clamping member slides relative to the first housing, the meshing part drives the meshing member to rotate by means of meshed transmission.

A holding mechanism as described in any one of the above, wherein, the holding mechanism further comprising a plurality of protecting members, and the plurality of protecting members are respectively provided on the side of the first clamping part facing the second clamping part and on the side of the second clamping part facing the first clamping part.

A bracket, comprising a connecting frame and a holding mechanism, and the holding mechanism comprises a first and a second clamping member, wherein the first clamping member comprises a first clamping part, the second clamping member comprises a second clamping part and a limiting part, and the second clamping member is slidably mounted on the first clamping member so as to adjust the spacing between the second clamping part and the first clamping part; the holding mechanism further comprises a limiter provided on the first clamping member, and the limiter is fitted with the limiting part so as to limit the relative sliding position of the first and second clamping members. The first clamping member is rotatably connected to the connecting frame.

In some embodiments, the holding mechanism further comprises a first elastic member. One end of the first elastic member is connected to the first clamping member and the other end thereof is connected to the second clamping member, so as to provide a restoring force of movement for the relative sliding between the first and second clamping members.

In some embodiments, the first clamping member comprises a first housing and a second housing snap-fitted with the first housing, and the first clamping part and the limiter are provided on the second housing; the second clamping member is slidably accommodated between the first housing and the second housing.

In some embodiments, the limiter is rotatably provided on the second housing and the limiter can be separated from or snapped with the limiting part by pressing or releasing the limiter.

In some embodiments, the limiting part is a sawtooth rack, and the limiter is a rotating stir wheel with one end thereof being snapped with the sawtooth rack and the other end thereof being an operating end.

In some embodiments, the holding mechanism further comprises a pressing member, the pressing member is provided on the second housing and can drive the limiter to rotate by pressing or releasing the pressing member.

In some embodiments, the limiter further comprises a second elastic member for providing a restoring force of rotation to the limiter.

In some embodiments, a meshing member is rotatably provided on the first housing and a meshing part for meshing with the meshing member is provided on the second clamping member.

In some embodiments, the meshing member is a gear, the meshing part is a rack, and when the second clamping member slides relative to the first housing, the meshing part drives the meshing member to rotate by means of meshed transmission.

A bracket as described in any one of the above, wherein, the holding mechanism further comprises a plurality of protecting members, and the plurality of protecting members are respectively provided on the side of the first clamping part facing the second clamping part and on the side of the second clamping part facing the first clamping part.

In some embodiments, the bracket further comprises a fastening assembly for adjusting the mounting position of the holding mechanism relative to the connecting frame.

In some embodiments, the fastening assembly comprises a fastening member penetrating the first clamping member and connected to the connecting frame.

In some embodiments, the fastening member is a screw or a bolt.

In some embodiments, a threaded part and a mating part connected to the threaded part are formed on the fastening member; the fastening assembly further comprises an operating member movably sheathed on the fastening member, and a snap-fitting part corresponding to the mating part is formed on the operating member;

Wherein the operating member can slide along the axial direction thereof relative to the fastening member under the action of an external force, until the snap-fitting part is snap-fitted with the mating part, such that the operating member drives the fastening member to rotate via the snap-fitting part.

In some embodiments, the fastening assembly further comprises a resetting member which provides an elastic restoring force to the operating member to enable the operating member to automatically reset after sliding.

In some embodiments, the resetting member is accommodated in the operating member. One end of the resetting member abuts against the fastening member, and the other end thereof abuts against the operating member.

In some embodiments, a first and a second sheathing hole are provided on the operating member along the axial direction thereof. The first and second sheathing holes are in communication with each other and penetrate through the entire operating member. The size of the first sheathing hole is smaller than that of the second sheathing hole, such that a stepped surface is formed at the position where the first and second sheathing holes are connected, and one end of the resetting member abuts against the stepped surface and the other end thereof abuts against the fastening member.

In some embodiments, the fastening member further comprises a flange part formed on the end of the mating part which is far away from the threaded part and the resetting member is sheathed on the mating part and abuts between the stepped surface and the flange part.

In some embodiments, the snap-fitting part is a snapping protrusion formed in the operating member; a snapping part is provided on the end of the mating part which is relatively far away from the threaded part; and the operating member slides along the axial direction relative to the fastening member, such that the snap-fitting part can be snapped with or separated from the snapping part.

In some embodiments, the snapping part is a slot provided on the mating part and extending along the circumferential direction of the mating part.

In some embodiments, the diameter of the threaded part is smaller than that of the mating part; a sliding groove is recessed on the mating part along the axial direction thereof; one end of the sliding groove penetrates to the threaded part and the other end thereof is in communication with the snapping part, and the snap-fitting part can slide along the sliding groove into the snapping part.

A bracket as described in any one of the above, wherein, the fastening assembly further comprises a locking member screwed with the fastening member, and the fastening member is screwed on the locking member after passing through the first clamping member and the connecting frame.

In some embodiments, the bracket further comprises a fastening shaft fixedly provided on the connecting frame and a fastening sleeve which is rotatably sheathed on the fastening shaft, and the fastening sleeve is used to fix the bracket as a whole to an external device by means of a threaded connection.

In some embodiments, the fastening shaft comprises a connecting end fixedly inserted in the connecting frame and a limiting end formed on the end of the connecting end, the fastening sleeve is sheathed on the connecting end and can rotate relative to the connecting end, and the limiting end is used to locate the connecting frame on the external device.

In some embodiments, outer threads are formed on the end of the fastening sleeve which is close to the limiting end, and when the fastening sleeve rotates relative to the fastening shaft, the fastening sleeve can be screwed with the external device so as to fix the bracket as a whole to the external device.

A remote controller, comprising a remote controller body and a control stick provided on the remote controller body, and furthermore, the remote controller further comprises a bracket as described in any one of the above, and the bracket is mounted on the remote controller body.

In some embodiments, one end of the bracket is rotatably connected to the remote controller body, and the other end is rotatably connected to the first clamping member.

In some embodiments, the remote controller further comprises a locating assembly for fixedly connecting the middle part of the connecting frame with the remote controller body.

In some embodiments, the locating assembly further comprises a fastening shaft fixedly provided on the connecting frame and a fastening sleeve which is rotatably sheathed on the fastening shaft, and the fastening sleeve is used to fix the bracket as a whole to the remote controller body by means of a threaded connection.

In some embodiments, the fastening shaft comprises a connecting end fixedly inserted in the connecting frame and a limiting end formed on the connecting end, wherein the fastening sleeve is sheathed on the connecting end and can rotate relative to the connecting end, and the limiting end is used to locate the connecting frame on the remote controller body.

In some embodiments, outer threads are formed on the end of the fastening sleeve which is close to the limiting end, and when the fastening sleeve rotates relative to the fastening shaft, the fastening sleeve can be screwed with the external device so as to fix the bracket as a whole to the remote controller body.

A holding mechanism for a remote controller provided in the present disclosure uses both the first and second clamping parts to clamp the external displaying device, the second clamping part can move relative to the first clamping part, such that the bracket can be applied to displaying devices of different sizes and the application range of the holding mechanism is broad. In addition, such holding mechanism limits the distance between the first clamping part and the second clamping part via the snapping between the limiter and the limiting part, such that the holding mechanism is applicable to displaying devices with larger size differences, which further enlarges the application range thereof. The limiter and the limiting part can be tightly snap-fitted such that the clamping from the holding mechanism to the displaying device is more reliable.

DETAILED DESCRIPTION OF THE EMBODIMENTS

Technical solutions of the present disclosure will be described with reference to the drawings. It will be appreciated that embodiments as described in the disclosure are some rather than all of the embodiments of the present disclosure. Other embodiments, which are conceived by those having ordinary skills in the art on the basis of the disclosed embodiments without inventive efforts, should fall within the scope of the present disclosure.

Figure 1:
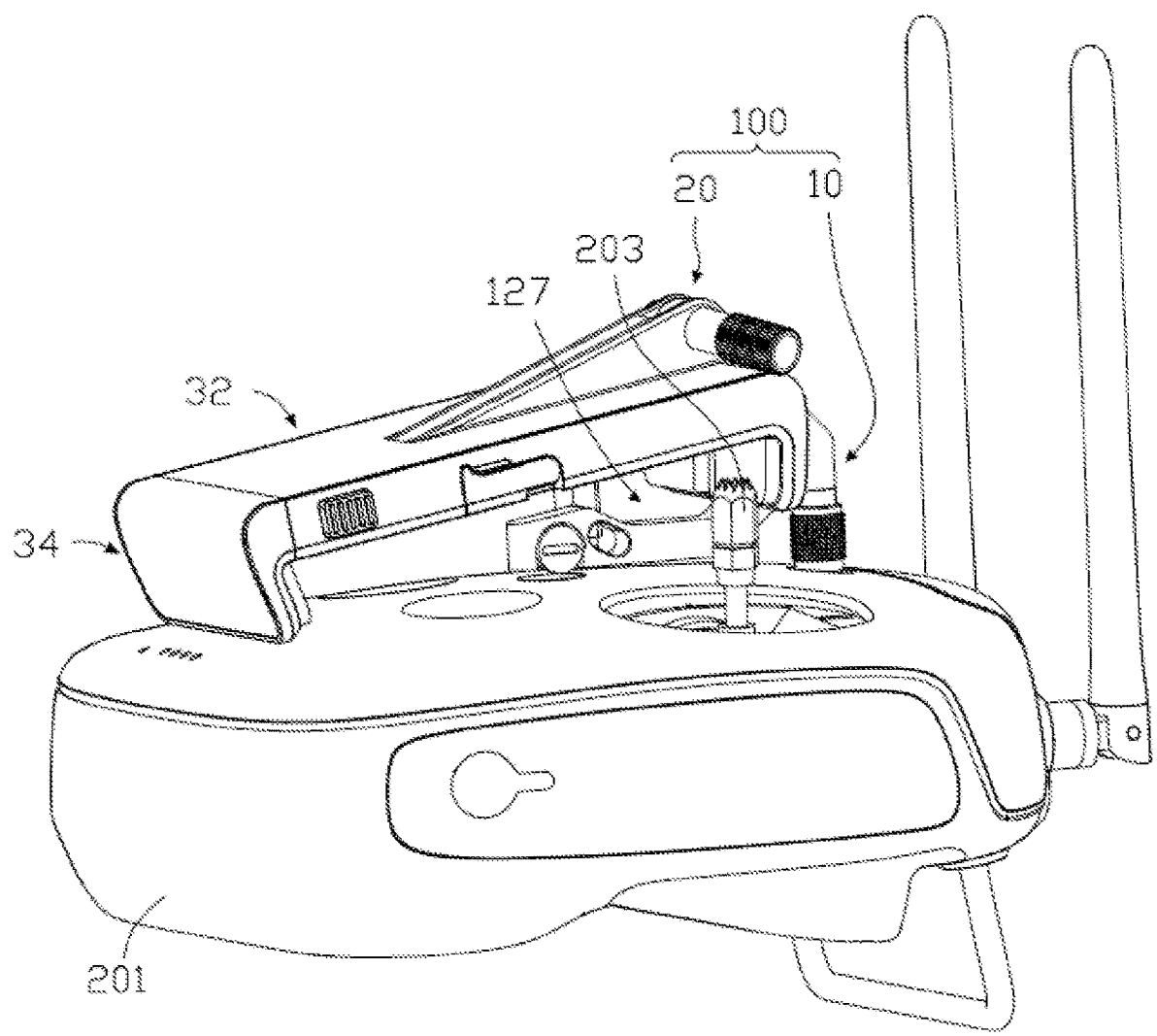
FIG. 1 is a three-dimensional assembly schematic diagram of a bracket and a remote controller using the bracket according to an embodiment of the present disclosure, with the bracket being in a first state.
Figure 2:
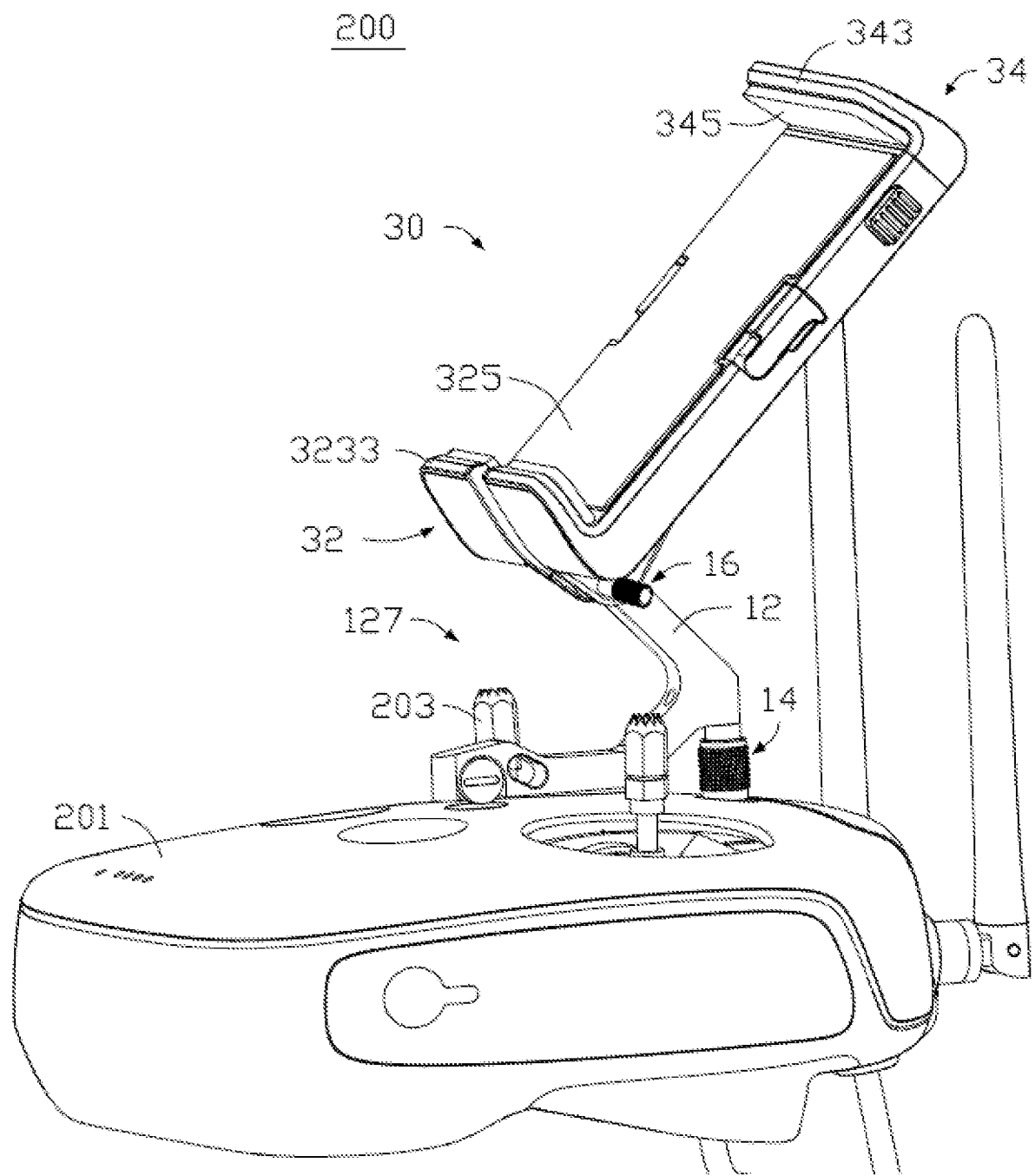
FIG. 2 is a three-dimensional assembly schematic diagram of the bracket and the remote controller using the bracket as shown in FIG. 1, with the bracket being in a second state.
Figure 3:
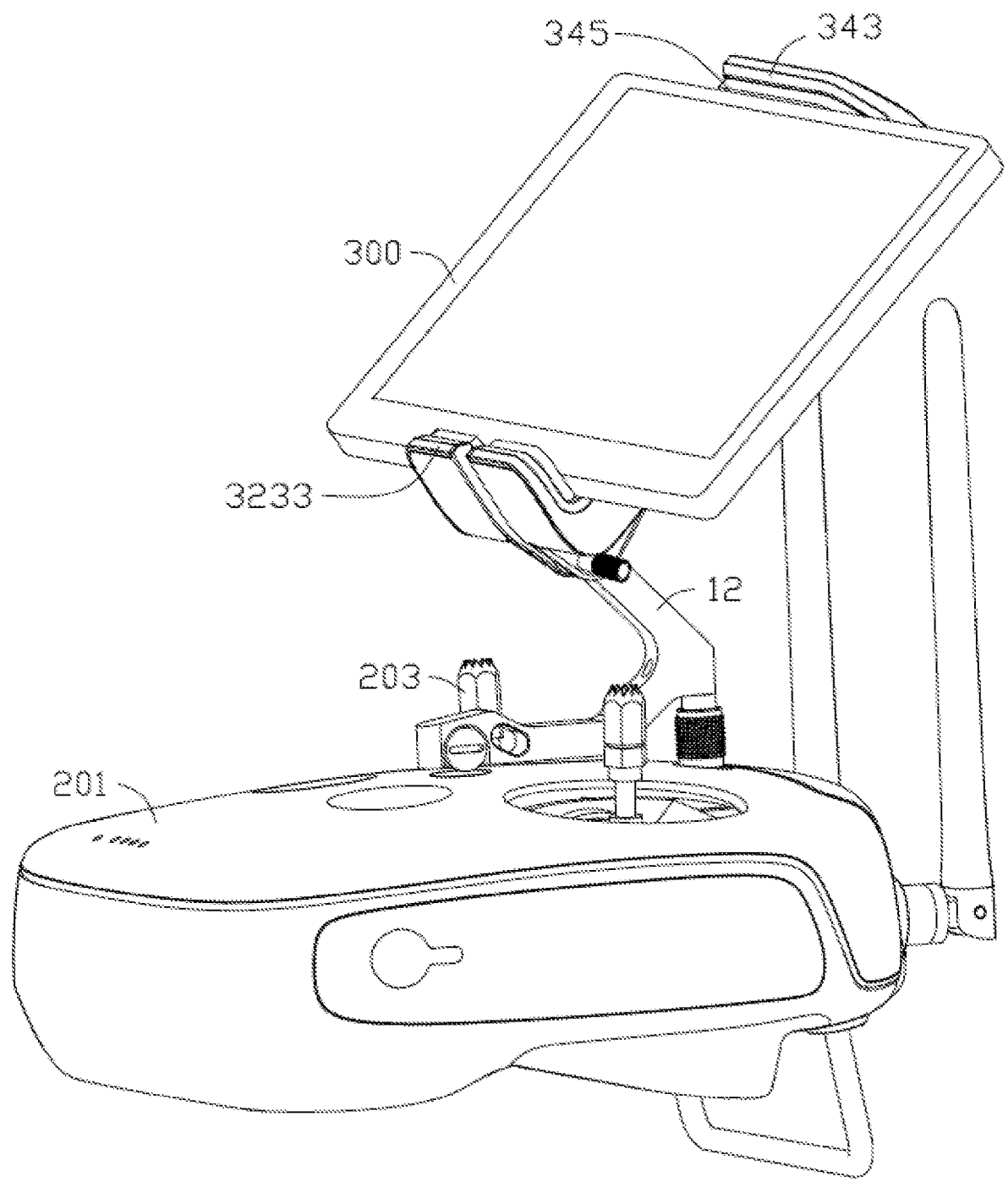
FIG. 3 is a three-dimensional schematic diagram of the bracket and the remote controller using the bracket as shown in FIG. 1, wherein the bracket and the remote controller are in an operation state.

Please refer to FIGS. 1-3, a remote controller 200 according to an embodiment of the present disclosure is shown, which is used for remotely controlling an aerial vehicle (not shown in the figures) carrying a shooting device (not shown in the figures), such as a video camera or a photo camera. A bracket 100 is mounted on the remote controller 200, the bracket 100 is used for mounting displaying devices (not shown in the figures), such as a display, a mobile phone, or a tablet computer; the bracket 100 is also electrically connected to and transmits data with the shooting device and the remote controller 200, such that the displaying device receives and displays the real-time images shot by the shooting device, and therefore the photographer can see the shooting effect in time.

The remote controller 200 comprises a remote controller body 201 and a control stick 203 provided on the remote controller body 201. The remote controller body 201 is used to provide a hand-holding position for a photographer so as to facilitate the operation by the photographer, and the control stick 203 is used to control the flying direction of the aerial vehicle. In this embodiment, the control stick 203 is an operating handle and the number thereof is two. It is understood that the numbers of the hand holding part 2013 and the control stick 203 can be one or more.

The bracket 100 is provided on the remote controller body 201 near the control stick 203 and comprises a seat 10 and a holding mechanism 30 connected to the seat 10.

The seat 10 comprises a connecting frame 12, and a locating assembly 14 and a fastening assembly 16 provided on the connecting frame 12.

Figure 4:
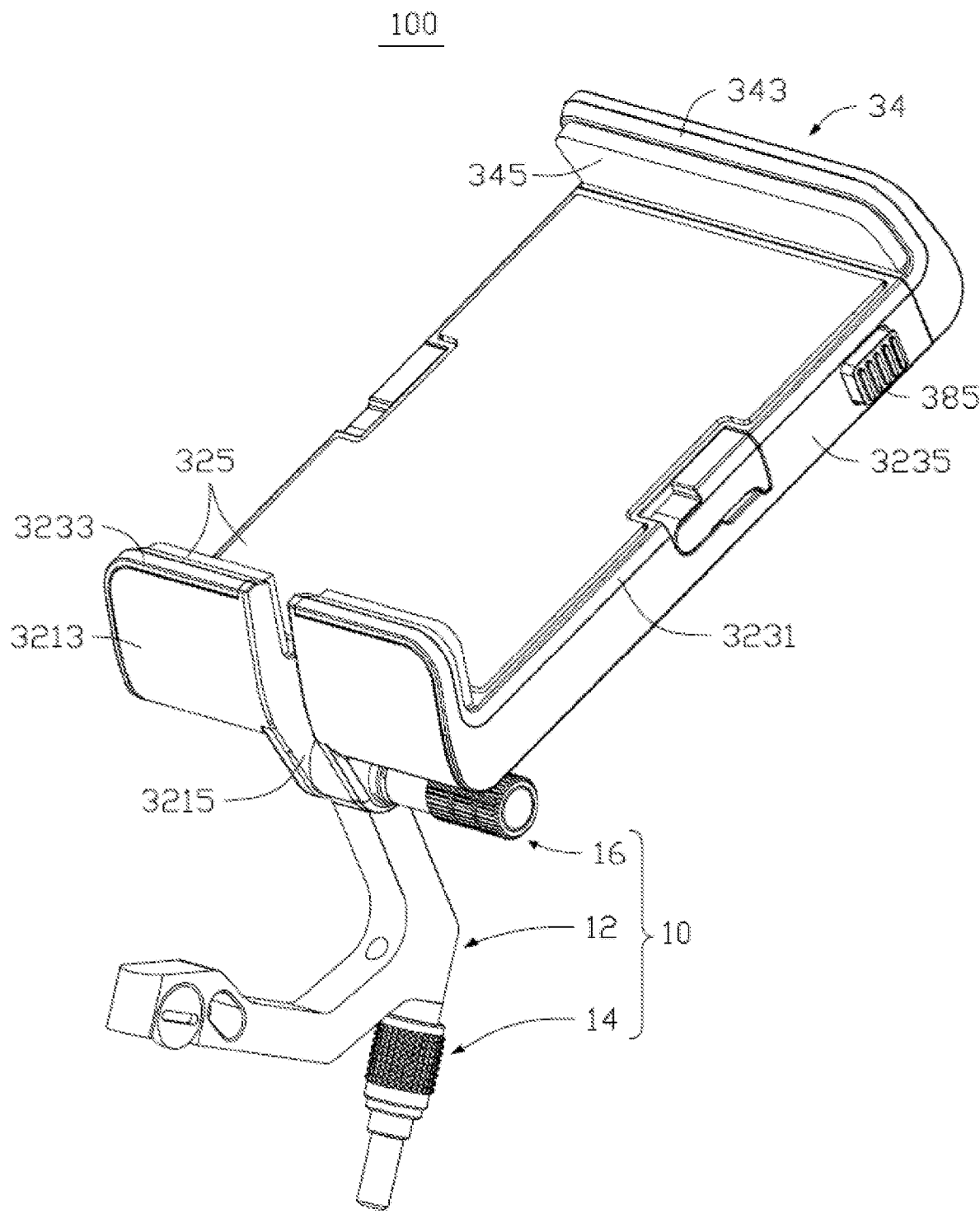
FIG. 4 is a three-dimensional schematic diagram of the bracket as shown in FIG. 1 in the first state.
Figure 5:
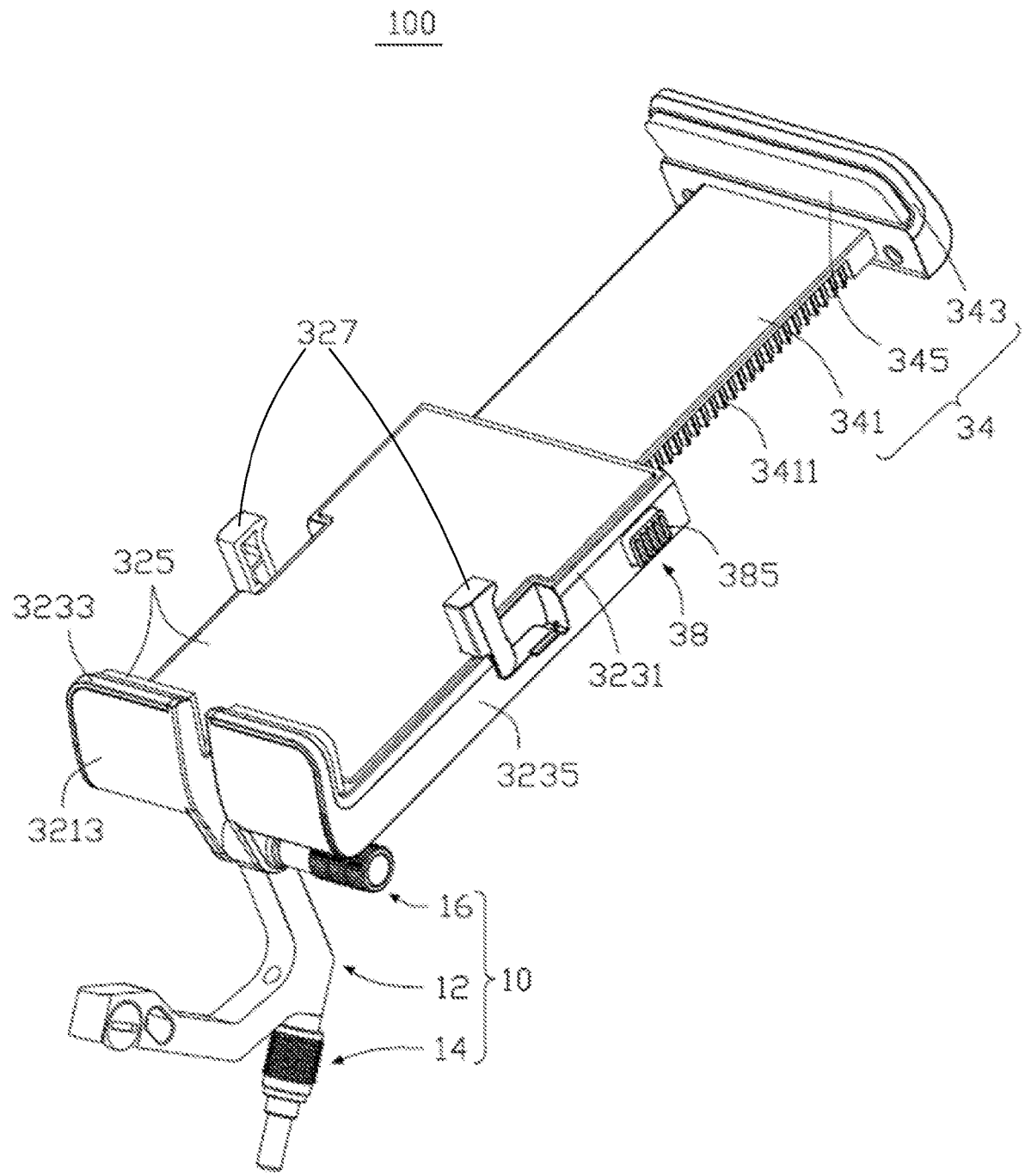
FIG. 5 is a three-dimensional schematic diagram of the bracket as shown in FIG. 4 in the second state.
Figure 6:
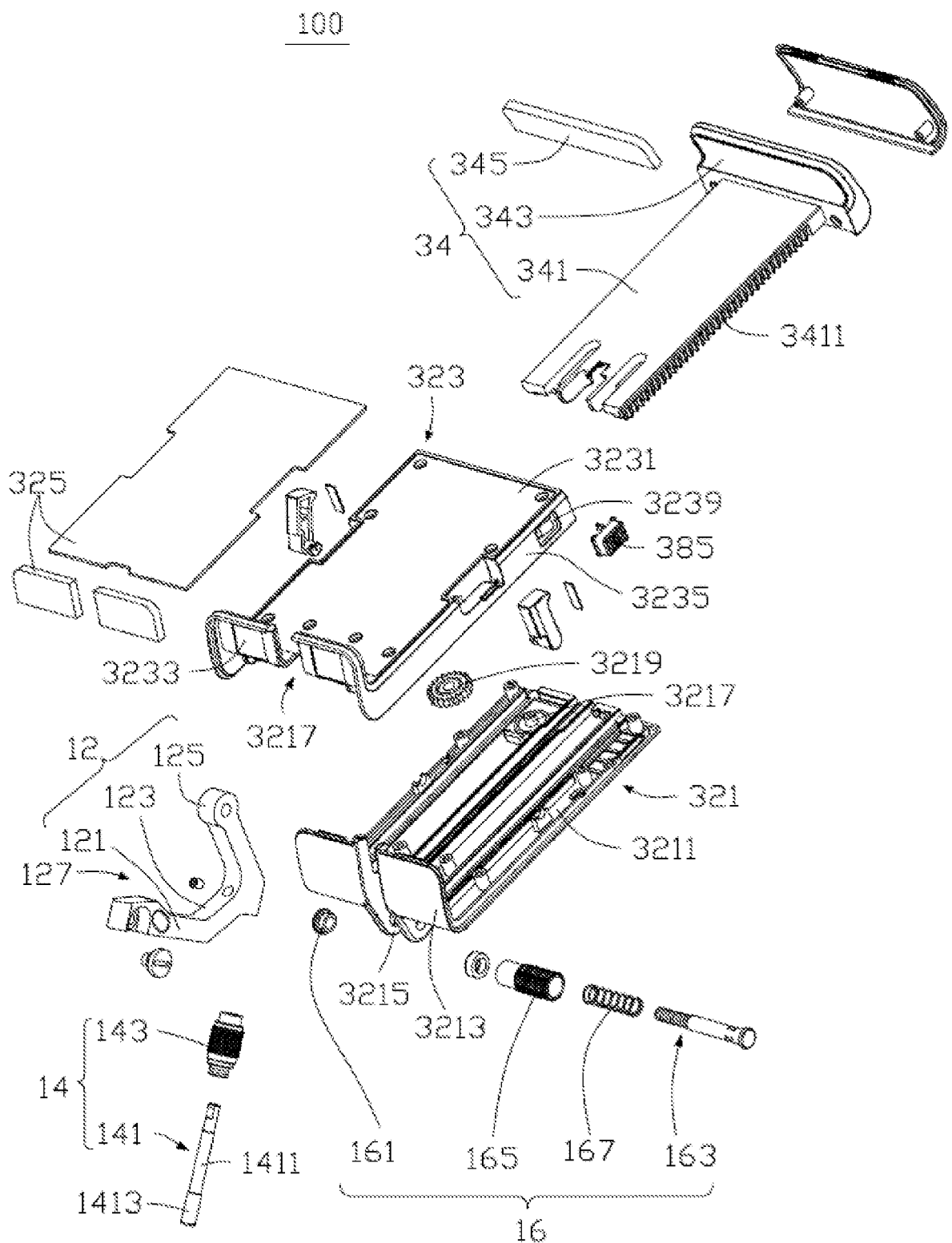
FIG. 6 is an exploded three-dimensional schematic diagram of the bracket as shown in FIG. 5.

Please refer to FIGS. 4-6, the connecting frame 12 is in an approximately U-shaped bent shape and is used for connecting to the remote controller body 201. The connecting frame 12 comprises an abutting and holding part 121, a supporting part 123 and a connecting part 125 which are successively connected. The abutting and holding part 121 overlies on the surface of the remote controller body 201. The supporting part 123 is formed by bending one end of the abutting and holding part 121, and extends towards the direction facing away from the remote controller body 201. The connecting part 125 is formed by bending the end of the supporting part 123 which is far away from the abutting and holding part 121, and extends towards the direction which is relatively close to the abutting and holding part 121, so as to form one piece in a bent U shape and form an accommodating space 127 together with the supporting part 123 and the abutting and holding part 121, and the accommodating space 127 is used to accommodate a part of the structure of the holding mechanism 30.

A locating assembly 14 is provided on the side of the supporting part 123 close to the remote controller body 201 and is used to fix the seat 10 as a whole to the remote controller body 201. The locating assembly 14 comprises a fastening shaft 141 and a fastening sleeve 143 sheathed on the fastening shaft 141.

The fastening shaft 141 is roughly in a cylindrical shape and comprises a connecting end 1411, and a limiting end 1413 formed at one end of the connecting end 1411. The connecting end 1411 is fixedly inserted onto the supporting part 123. The outer diameter of the limiting end 1413 is larger than that of the connecting end 1411, and the limiting end is inserted into a locating hole (not shown in the figures) of the remote controller body 201 so as to locate the connecting frame 12. The fastening sleeve 143 is provided with a through hole (not shown in the figures) in an axial direction, the size of the through hole is larger than the outer diameter of the connecting end 1411 and is smaller than the outer diameter of the limiting end 1413, such that the fastening sleeve 143 cannot fall off of the fastening shaft 141 when the fastening sleeve 143 is rotatably sheathed outside the connecting end 1411 of the fastening shaft 141 via the through hole. Connecting outer threads are formed on the end of the fastening sleeve 143 which is close to the limiting end 1413, and the connecting outer threads are used to be screwed with the locating hole on the remote controller body 201 so as to fix the connecting frame 12 on the remote controller body 201.

The fastening assembly 16 is provided on the connecting part 125 and is used to connect the holding mechanism 30 to the connecting frame 12. The fastening assembly 16 comprises a locking member 161, a fastening member 163 for connecting the locking member 161, an operating member 165 sheathed on the fastening member 163 and a resetting member 167 accommodated in the operating member 165.

In this embodiment, the locking member 161 is a hexagon nut, provided near the end of the connecting part 125 which is far away from the supporting part 123, and located on one side of the connecting part 125.

Figure 7:
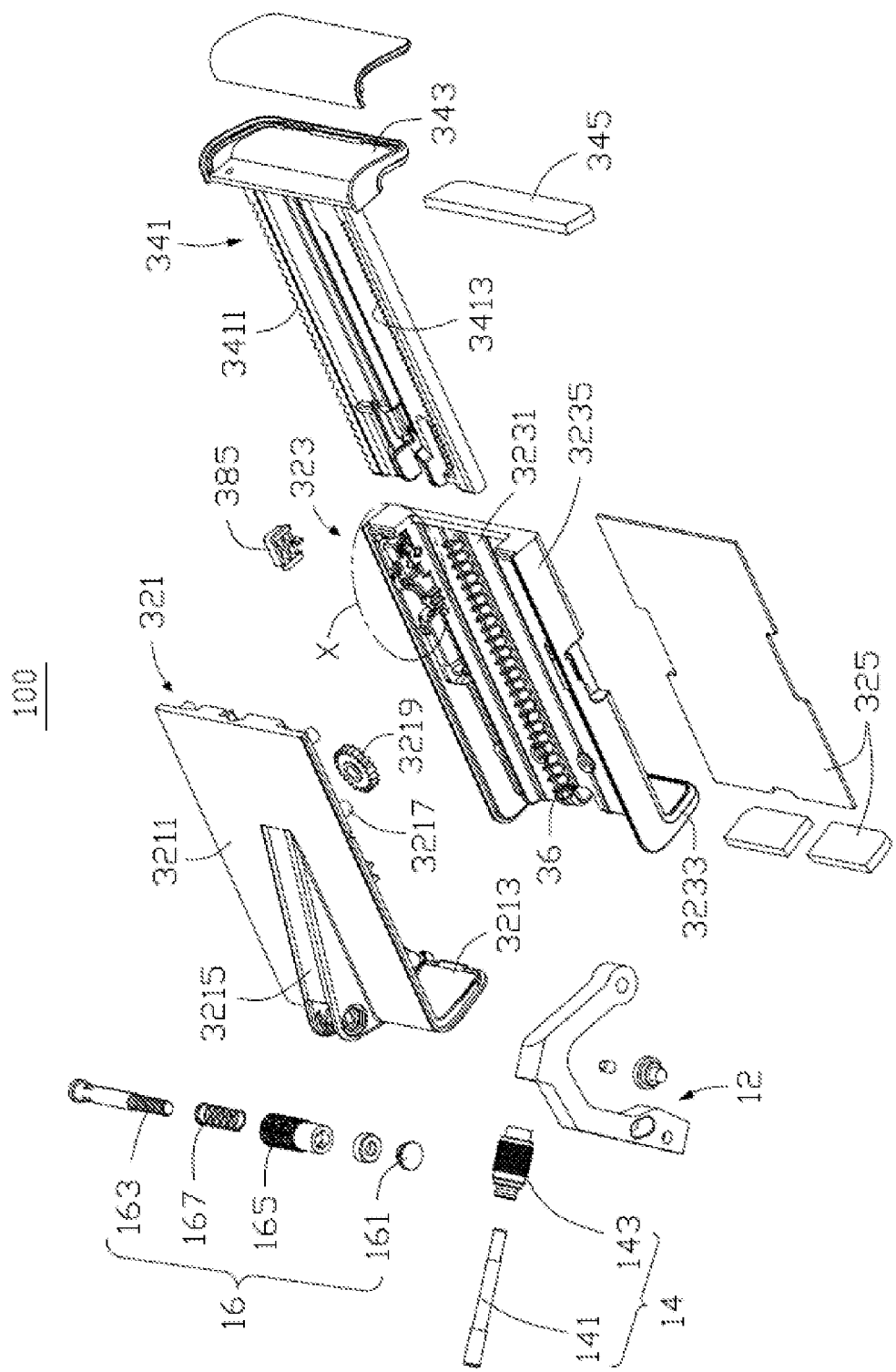
FIG. 7 is an exploded three-dimensional schematic diagram of the bracket as shown in FIG. 5 from another viewing angle.
Figure 8:
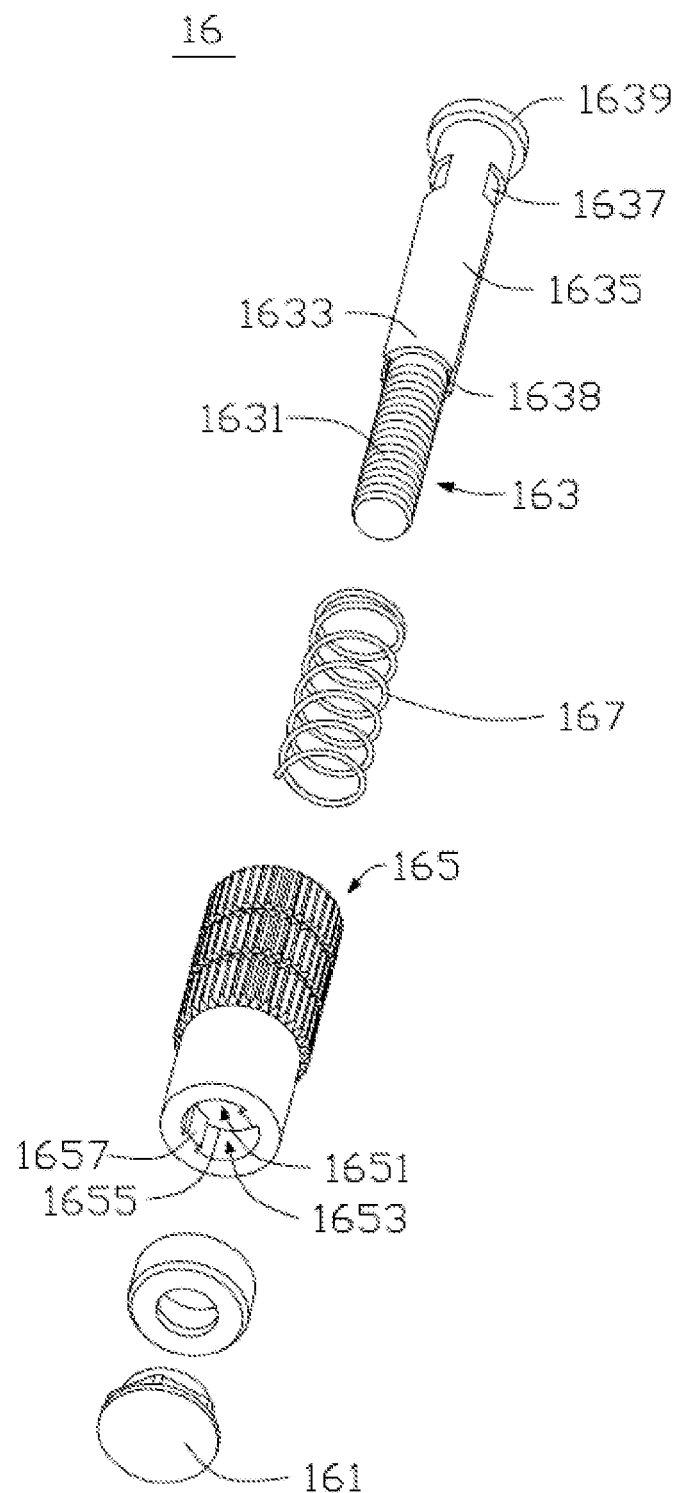
FIG. 8 is an exploded three-dimensional schematic diagram of the fastening assembly of the bracket as shown in FIG. 6.

Please refer to FIGS. 7 and 8, the fastening member 163 is in an approximately cylindrical shape and one end thereof passes through the connecting part 125 and is screwed with the locking member 161. The fastening member 163 comprises a threaded part 1631, an abutting and bearing part 1633, a mating part 1635 and a flange part 1639 which are successively connected. The threaded part 1631 is provided with outer threads and is used to be screwed with the locking member 161. The abutting and bearing part 1633 is formed on the end of the threaded part 1631 which is far away from the locking member 161 and the outer diameter thereof is larger than that of the threaded part 1631. The mating part 1635 is formed on the end of the abutting and bearing part 1633 which is far away from the threaded part 1631 and is used to be snapped with or separated from the operating member 165. The outer circumferential wall of the mating part 1635 is recessed to form a snapping part 1637 and a sliding groove 1638. The snapping part 1637 is provided at the end, which is far away from the abutting and bearing part 1633, of the outer circumferential wall of the mating part 1635 and is a slot extending along the circumferential direction of the mating part 1635. The sliding groove 1638 is provided along the axial direction of the mating part 1635, one end thereof penetrates the end surface of the abutting and bearing part 1633 which is far away from the mating part 1635, and the other end is in communication with the snapping 1637. In this embodiment, the numbers of the snapping part 1637 and the sliding groove 1638 are two; the two snapping parts 1637 are arranged on two opposite sides of the mating part 1635 facing away from each other, and each sliding groove 1638 corresponds to one snapping part 1637 and is in communication with the corresponding snapping part 1637. The flange part 1639 is formed on the end of the mating part 1635 which is far away from the abutting and bearing part 1633, and the outer diameter thereof is larger than that of the mating part 1635. The flange part 1639 is used to stop the resetting member 167 by abutting.

The operating member 165 is in an approximately cylindrical shape and can be movably sheathed on the fastening member 163 for providing a convenient operating part for a user, such that the user can screw the fastening member 163 out of the locking member 161 via the operating member 165. A first sheathing hole 1651 and a second sheathing hole 1653 are provided on the operating member 165 along the axial direction thereof, and the first sheathing hole 1651 and the second sheathing hole 1653 are in communication with each other and penetrate the entire operating member 165. The first sheathing hole 1651 is provided close to the locking member 161 and the second sheathing hole 1653 is provided on the end of the first sheathing hole 1651 which is far away from the locking member 161. The bore diameter of the second sheathing hole 1653 is larger than that of the first sheathing hole 1651, such that a stepped surface 1655 is formed at the position where the first sheathing hole 1651 and the second sheathing hole 1653 are connected. The stepped surface 1655 is used to abut against the flange part 1639 to prevent the operating member 165 from falling off of the fastening member 163 when the operating member 165 moves along the fastening member 163. A snap-fitting part 1657 protrudes from and is formed on the inner wall of the first sheathing hole 1651. In this embodiment, the number of the snap-fitting parts 1657 is two, and each snap-fitting part 1657 corresponds to one snapping part 1637. The distance between the two snap-fitting parts 1657 is smaller than the maximum outer diameter of the mating part 1635 and the abutting and bearing part 1633, and when driven by an external force applied along the axial direction of the operating member 165, the snap-fitting parts 1657 can slide along the lengthwise direction of the sliding groove 1638 and are accommodated in the corresponding snapping part 1637. When the operating member 165 is driven by an external force to rotate relative to the fastening member 163, the snap-fitting part 1657 slides in the snapping part 1637 along a circumferential direction and abuts against the side wall of the snapping part 1637. The operating member 165 continues rotating when driven by the external force, the snap-fitting part 1657 pushes against the side wall of the snapping part 1637 to drive the fastening member 163 to rotate along with the operating member 165, such that the fastening member 163 moves relatively further away from or closer to the locking member 161.

The resetting member 167 is sheathed on the mating part 1635 and is accommodated in the second sheathing hole 1653. In this embodiment, the resetting member 167 is a helical compression spring. One end of the resetting member 167 abuts against the flange part 1639 and the other end abuts against the stepped surface 1655. When the operating member 165 is relatively far away from the flange part 1639, the snap-fitting part 1657 abuts against the end surface of the abutting and bearing part 1633 and the resetting member 167 is in a normal state. When the operating member 165 is driven by an external force to move close to the flange part 1639, the snap-fitting part 1657 slides along the sliding groove 1638 towards the corresponding snapping part 1637 and the resetting member 167 is gradually compressed. When the snap-fitting part 1657 slides to the snapping part 1637 and is steadily accommodated in the snapping part 1637, the resetting member 167 is in a compressed state and stores elastic energy. At this time, abutted by the resetting member 167, the end surface of the snap-fitting part 1657 abuts against the side wall of the snapping part 1637. When the operating member 165 rotates under the driving by an external force to cause the snap-fitting part 1657 to slide along the circumferential direction of the fastening member 163 on the side wall of the snapping part 1637 to the corresponding slide groove 1638, the end surface of the snap-fitting part 1657 is no longer stopped by the side wall of the snapping part 1637, and, under the action of a resetting elastic force of the resetting member 167, the snap-fitting part 1657 slides along the sliding groove 1638 and moves away from the flange part 1639, such that the operating member 165 as a whole moves away from the flange part 1639.

Please refer to FIGS. 5 and 6 again, the holding mechanism 30 is connected to the connecting frame 12 via the fastening assembly 16 and is used to hold a displaying device, such as a display, a mobile phone or a tablet computer. The holding mechanism 30 comprises a first clamping member 32, and a second clamping member 34 and a first elastic member 36 both movably accommodated in the first clamping member 32, and a limiting assembly 38 provided on the first clamping member 32.

The first clamping member 32 is connected to the connecting frame 12, and comprises a first housing 321, a second housing 323 snap-fitted with the first housing 321 and a first protecting member 325 provided on the second housing 323.

The first housing 321 is an approximately L-shaped bent plate, and comprises a bottom housing 3211, as well as a bent part 3213 and a locking part 3215 which are both formed on the bottom housing 3211.

The bottom housing 3211 is an approximately rectangular plate, and the bent part 3213 is bent and formed on the end of the bottom housing 3211 which is close to the connecting frame 12. The locking part 3215 protrudes from and formed on the side of the bottom housing 3211 facing towards the remote controller body 201, and is close to the bent part 3213. In this embodiment, the locking part 3215 is approximately in a plate shape and the number thereof is two. The two locking parts 3215 are arranged with a space in between and approximately perpendicular to the bottom housing 3211. The two locking parts 3215 are respectively located on two sides of the connecting part 125 of the connecting frame 12, the locking member 161 is provided on one of the two locking parts 3215, and on the side of the locking part 3215 facing away from the connecting part 125, and the fastening member 163 is screwed with the locking member 161 after successively passing through the other one of the two locking parts 3215, the connecting part 125 and the above the locking part 3215. The fastening member 163 continues rotating after the fastening member 163 rotates to screw with the locking member 161, so that the abutting and bearing part 1633 of the fastening member 163 is abutted against the corresponding locking part 3215 and cooperates with the locking member 161 to tightly clamp the two locking parts 3215, and the two locking parts 3215 tightly clamp the connecting part 125 after elastic deformation occurs, such that the holding mechanism 30 can be solidly mounted on the seat 10.

Furthermore, a pivot connection part 3217 is formed on and protrudes from the side of the bottom housing 3211 facing away from the remote controller body 201, and the pivot connection part 3217 is approximately in a shaft shape. The pivot connection part 3217 is rotatably provided with a meshing member 3219. In this embodiment, the meshing member 3219 is a gear and the outer circumference thereof is provided with a plurality of meshing teeth (not marked in the figures).

The second housing 323 covers the first housing 321. The second housing 323 is an approximately L-shaped bent housing and comprises a top housing 3231, as well as a first clamping part 3233 and a side wall 3235 which are both formed on the top housing 3231.

The top housing 3231 is an approximately rectangular plate and is provided on the side of the bottom housing 3211 facing away from the remote controller body 201 and is approximately parallel with the bottom housing 3211. The first clamping part 3233 is near the bent part 3213, formed on one end of the top housing 3231 and covers the bent part 3213. In this embodiment, the number of the side wall 3235 is two. The two side walls 3235 are formed by respectively bending two sides of the top housing 3231, which extend towards the bottom housing 3211. The two side walls 3235, the top housing 3231 and the bottom housing together form an accommodating cavity 3237 and the accommodating cavity 3237 is used to partially accommodate the second clamping member 34. A mounting hole 3239 is located on and penetrates one of the two side walls 3235. The mounting hole 3239 is located at the end of the corresponding side wall 3235 which is far away from the first clamping part 3233 and is used to mount a part of the structure of the limiting assembly 38.

The first protecting member 325 covers the top housing 3231 and the surface of the first clamping part 3233 facing away from the remote controller body 201, and is used to protect the clamped displaying device from scratches. In this embodiment, the first protecting member 325 is made of an elastic material. In particular, the first protecting member 325 may be made of foam. It is understood that the first protecting member 325 can also be made of another elastic material, such as rubber.

The second clamping member 34 is partially and movably inserted in the accommodating cavity 3237, and comprises a moving part 341, a second clamping part 343 provided on one end of the moving part 341, and a second protecting member 345 provided on the second clamping part 343.

Figure 9:
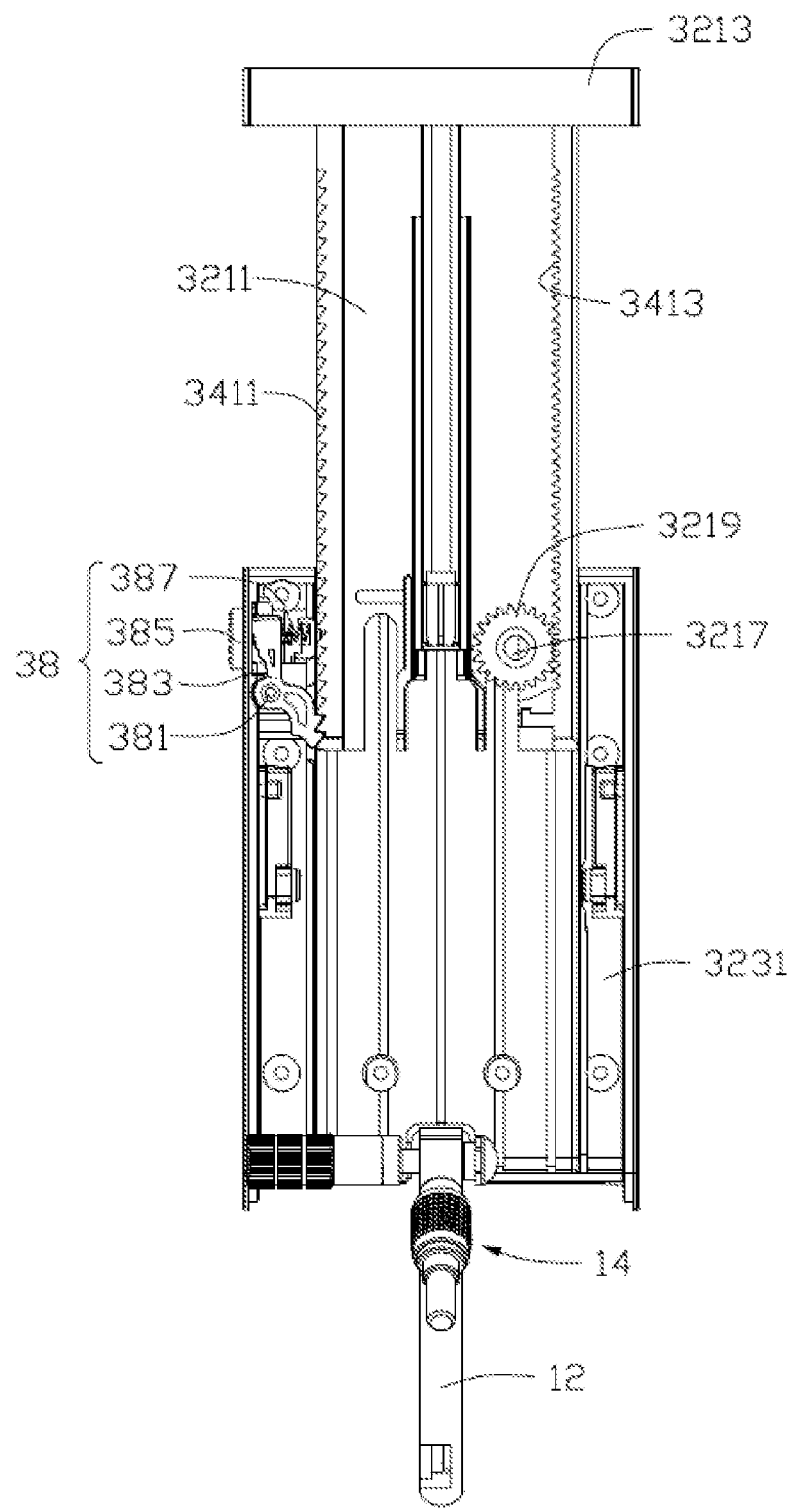
FIG. 9 is a schematic diagram of the internal structure of the bracket as shown in FIG. 5.

Please refer to FIGS. 7 and 9, the moving part 341 is an approximately rectangular plate and is accommodated in the accommodating cavity 3237. A limiting part 3411 is formed on the side of the moving part 341 facing towards the mounting hole 3239. In this embodiment, the limiting part 3411 is in a sawtooth rack shape and is used to snap with the limiting assembly 38 so as to limit the mounting position of the second clamping member 34 relative to the first clamping member 32. The moving part 341 is also provided with a meshing part 3413 on the side facing towards the bottom housing 3211, and the meshing part 3413 is formed correspondingly to the meshing member 3219. In this embodiment, the meshing part 3413 is a rack meshing with the meshing member 3219. When the moving part 341 slides relative to the first clamping member 32, the meshing part 3413 meshes with the meshing member 3219, such that the sliding is smoother and resistant to shaking.

The second clamping part 343 is provided on the end of the moving part 341 which is far away from the first clamping part 3233 and faces the second clamping part 343 in a parallel manner. The second clamping part 343, the first clamping part 3233 and the top housing 3231 together form a clamping space (not marked in the figures) for accommodating the displaying device. Under the action of an external force, the second clamping part 343 can move relatively away from or close to the first clamping part 3233, such that the holding mechanism 30 can hold displaying devices of different sizes.

The second protecting member 345 is provided on the side of the second clamping part 343 facing towards the first clamping part 3233, and the material and function thereof are approximately the same as the first protecting member 325. In order to avoid redundancy, details will not be repeated herein in the description.

The first elastic member 36 is provided between the moving part 341 and the top housing 3231, one end thereof is connected to the bent part 3213 and the other end is connected to the second clamping member 34. In this embodiment, the first elastic member 36 is a compression spring. In an original state, i.e. when the moving part 341 is almost completely accommodated in the accommodating cavity 3237, the first elastic member 36 is in a compressed state. When the second clamping part 343 of the second clamping member 34 moves towards the direction away from the first clamping part 3233, the first elastic member 36 is gradually stretched to store elastic energy, so as to provide a restoring force of movement to the second clamping member 34.

Furthermore, the first clamping member 32 further comprises a third clamping part 327, and the third clamping part 327 is rotatably connected to the first housing 321 or/and the second housing 323. When the third clamping part 327 rotates to the position perpendicular to the first housing 321 and/or the second housing 323, a clamping space for clamping external devices such as a tablet computer or a mobile phone is formed between the third clamping part 327 and the second clamping part 343.

In particular, in the embodiments as shown in the figures, the third clamping part 327 is rotatably connected to the second housing 323 via a pivot shaft, and an accommodating groove for accommodating the third clamping part 327 is provided on the second housing 323. When the third clamping part 327 rotates to the position perpendicular to the first housing 321 and/or the second housing 323, the third clamping part 327 abuts against the side wall of the accommodating groove facing the second clamping part 343.

The specific structures of the third clamping part 327 can be designed according to different requirements, for example, in the embodiments as shown in the figures, the third clamping part 327 is a clamping hook and can be snapped with an external device such as a tablet computer or a mobile phone to prevent the external device from falling off.

Figure 10:
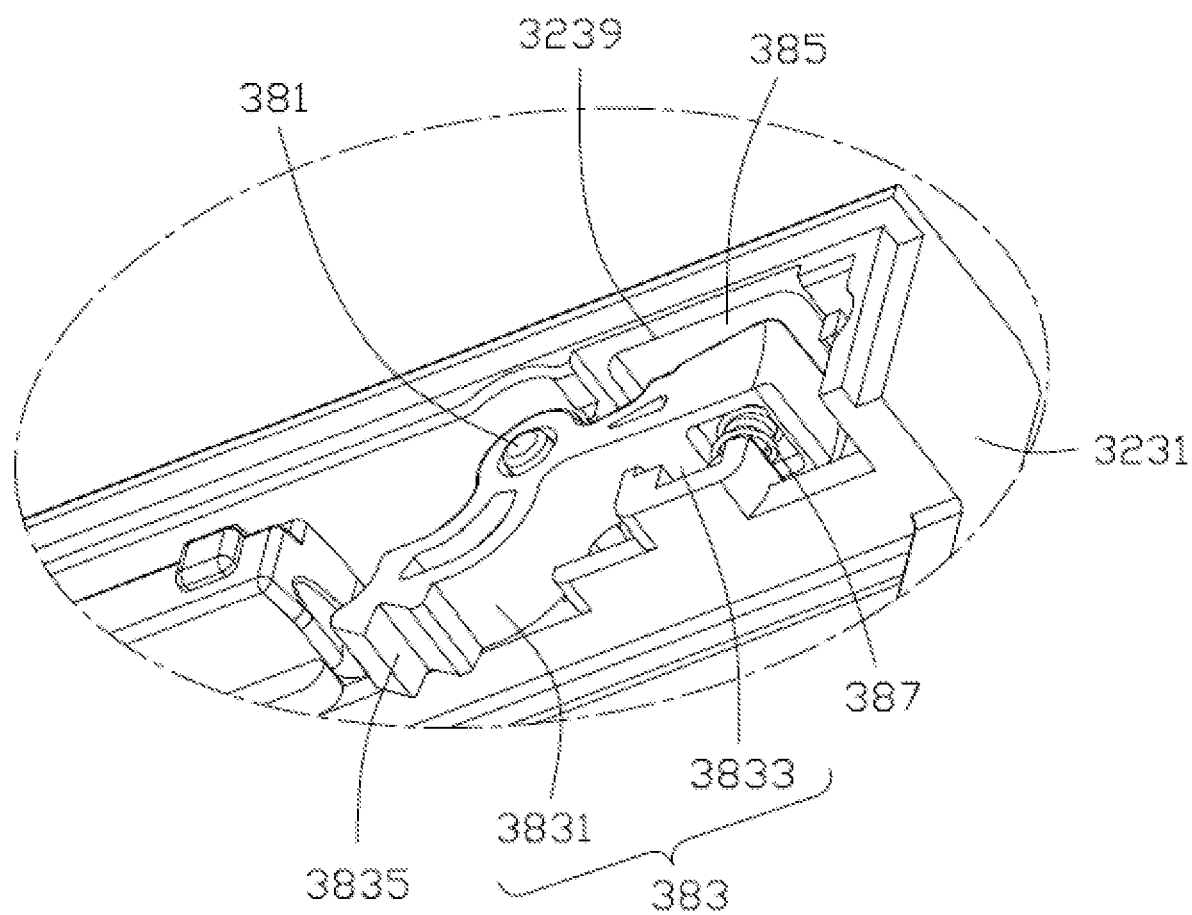
FIG. 10 is an enlarged schematic diagram of the region X of the bracket as shown in FIG. 7.

Please refer to FIG. 10, the limiting assembly 38 is provided on the bottom housing 3211 corresponding to the mounting hole 3239 and is used to be snapped with the limiting part 3411, so as to limit the mounting position of the second clamping member 34 relative to the first clamping member 32. The limiting assembly 38 comprises a pivot shaft 381, a limiter 383 rotatably sheathed on the pivot shaft 381, and a pressing member 385 and the second elastic member 387 both provided on the limiter 383.

The pivot shaft 381 is fixedly provided on the top housing 3231 and close to the limiting part 3411 on the moving part 341. The limiter 383 is in an approximately bent block shape and the approximately middle position thereof is rotatably sheathed on the pivot shaft 381. Under the action of an external force, the limiter 383 can rotate around the pivot shaft 381. In this embodiment, the limiter 383 is a rotating stir wheel with one end thereof being snapped with the sawtooth rack of the limiting part 3411 and the other end thereof being an operating end. Particularly, the limiter 383 comprises a rotating part 3831 and a pressing part 3833 formed on one end of the rotating part 3831. The rotating part 3831 extends from the pivot shaft 381 towards the limiting part 3411; the pressing part 3833 extends from the pivot shaft 381 towards the mounting hole 3239; and a certain angle is formed between the rotating part 3831 and the pressing part 3833. The end of the rotating part 3831 which is close to the limiting part 3411 protrudes to form a stopping part 3835. In this embodiment, the stopping part 3835 is in a protruding tooth shape and is used to snap the saw teeth of the limiting part 3411. The pressing member 385 is mounted in the mounting hole 3239 with one end being abutted against the pressing part 3833 of the limiter 383 and the other end protruding out of the side wall 3235. One end of the second elastic member 387 is connected to the pressing part 3833 and the other end is connected to the top housing 3231. In this embodiment, the second elastic member 387 is a helical compression spring.

When the pressing member 385 is pressed by an external force, the limiter 383 is driven thereby to rotate around the pivot shaft 381, such that the second elastic member 387 elastically deforms and is compressed, and at the same time, the pressing part 3833 brings the stopping part 3835 to move away from the limiting part 3411, therefore the stopping part 3835 is no longer snap-fitted with the limiting part 3411, and the second clamping member 34 can move relative to the first clamping member 32. When the external force is lifted and under the action of the elastic restoring force of the second elastic member 387, the limiter 383 rotates reversely around the pivot shaft 381 and the stopping part 3835 is again snapped in the limiting part 3411, such that the second clamping member 34 is fixed relative to the first clamping member 32.

When assembling the bracket 100 in this embodiment, firstly, the limiting assembly 38 is arranged on the second housing 323 and the moving part 341 is arranged in a parallel manner on the top housing 3231, such that the stopping part 3835 is snapped in the limiting part 3411. The meshing member 3219 is rotatably arranged on the bottom housing 3211; the first elastic member 36 is connected between the bent part 3213 and the second clamping member 34; and then the first housing 321 is snap-fitted on the second housing 323, such that the meshing member 3219 is meshed with the meshing part 3413. Next, the first protecting member 325 and the second protecting member 345 are arranged on the first clamping part 3233, the top housing 3231 and the second clamping part 343. Then, the holding mechanism 30 is mounted on the connecting frame 12 via the fastening assembly 16, and then the locating assembly 14 is arranged on the connecting frame 12. When the bracket 100 needs to be mounted on the remote controller body 201, firstly, the fastening shaft 141 is inserted in the locating hole of the remote controller body 201 and then the fastening sleeve 143 is screwed in the locating hole, thereby firmly mounting the bracket 100 on the remote controller body 201.

Please again refer to FIG. 1, wherein in a non-use state, the holding mechanism 30 is approximately parallel to the remote controller body 201, the top housing 3231 thereof faces the remote controller body 201, and the first clamping part 3233 is partially accommodated in the accommodating space 127 of the connecting frame 12. At this time, the fastening assembly 16 steadily fixes the holding mechanism 30 on the connecting frame 12 and the operating member 165 of the fastening assembly 16 is relatively close to the locking member 161.

When using the bracket 100 and the remote controller 200 of the present disclosure, firstly, the operating member 165 rotates to cause the snap-fitting part 1657 to correspond to the sliding groove 1638 and then the operating member 165 is pulled to move away from the locking member 161. When the snap-fitting part 1657 slides into the snapping part 1637 along the sliding groove 1638, the operating member 165 is slightly rotated along a first direction to enable the snap-fitting part 1657 to be dislocated from the sliding groove 1638 and to abut against the side wall of the snapping part 1637. The operating member 165 continues rotating along the first direction, the operating member 165 pushes against the side wall of the snapping part 1637 via the snap-fitting part 1657, such that the fastening member 163 as a whole rotates and moves relatively away from the locking member 161, thereby enabling the two locking parts 3215 to be restored elastically and the connecting part 125 clamped between the two locking parts 3215 to be released. At this time, the holding mechanism 30 is rotatable relative to the seat 10.

Secondly, the holding mechanism 30 rotates around the fastening assembly 16 until the holding mechanism 30 rotates to a required operating angle, the operating member 165 rotates along a second direction opposite to the first direction, such that the operating member 165 brings the fastening member 163 to rotate until it is screwed with the locking member 161, and the fastening member 163 and the locking member 161 together clamp the two locking parts 3215, thereby fixing the holding mechanism 30 relative to the seat 10. Again, the operating member 165 slightly rotates along the first direction, and the operating member 165 is released after the snap-fitting member 1657 corresponds to the sliding groove 1638. Under the action of the elastic restoring force of the resetting member 167, the snap-fitting part 1657 slides along and moves away from the flange part 1639 along the sliding groove 1638, and the operating member 165 as a whole is relatively close to the locking member 161.

Then, an external force is applied to the pressing member 385, such that the snap-fitting between the stopping part 3835 and the limiting part 3411 is lifted, and at the same time, the second clamping part 343 is pulled to enable it to move away from the first clamping part 3233. At this time, the first elastic member 36 is stretched and stores elastic energy. When the spacing between the first clamping part 3233 and the second clamping part 343 meets requirements, the second clamping part 343 and the pressing member 385 are released, such that the first clamping part 3233 is fixed relative to the second clamping part 343.

At last, a displaying device such as a mobile phone, a display or a tablet computer is mounted between the first clamping part 3233 and the second clamping part 343. The pressing member 385 is pressed again, and under the action of the elastic restoring force of the first elastic member 36, the second clamping member 343 is relatively close to the first clamping part 3233 and abuts against the displaying device. The first elastic member 36 still has the tendency to recover from a deformed state to a normal state and the elastic force thereof is converted into the clamping force for the displaying device, thereby holding the displaying device on the holding mechanism 30. The pressing member 385 is released again to enable the stopping part 3835 to once again be snapped with the limiting part 3411, and the clamping part 3233 and the second clamping part 343 are thus further fixed so that the displaying device is firmly clamped on the holding mechanism 30.

When the installation angle of the holding mechanism 30 relative to the remote controller body 201 needs to be adjusted, the fastening assembly 16 is released according to the method, such that the holding mechanism 30 is rotatable relative to the seat 10. The holding mechanism 30 rotates to the needed installation angle, and the holding mechanism 30 is once again fixed relative to the seat 10 via the holding mechanism 16. Such holding mechanism 30 of the remote controller 200 of the present disclosure uses both the first clamping part 3233 and second clamping part 343 to clamp the displaying device, the second clamping part 343 can move relative to the first clamping part 3233, such that the bracket 100 can be applied to displaying devices of different sizes and the application range of the holding mechanism is broad. In addition, the holding mechanism 30 limits the distance between the first clamping part 3233 and the second clamping part 343 by snapping with the limiter 383 and the limiting part 3411, such that the holding mechanism 30 is applicable to displaying devices with larger size differences, which further enlarges the application range of the holding mechanism. The limiter 38 and the limiting part 3411 can be firmly snap-fitted, such that the clamping from the holding mechanism on the displaying device is more reliable. Moreover, the installation position of the holding mechanism 30, as a whole, relative to the remote controller body 201 can be adjusted via the fastening assembly 16, such that the use of the remote controller 200 is more flexible.

It is understood that the resetting member 167 can be omitted and when using the bracket 100, the operating member 165 can be reset manually.

It is understood that the first elastic member 36 can be an elastic member of another structure, for example, a torsional spring, a coil spring, an elastic plate, an elastic sleeve, etc., and one end of the first elastic member 36 is connected to the first clamping member 32 and the other end is connected to the second clamping member 34, thereby providing a restoring force of movement for the second clamping member 34 or providing a clamping force for the second clamping member 34 in an operation state, such that the holding mechanism 30 can hold displaying devices of different sizes. It is understood that the number of the first elastic member 36 can be one or more.

It is understood that the first elastic member 36 can be omitted, and when using the holding mechanism 30, the mounting position of the first clamping member 32 relative to the second clamping member 34 can be limited by snapping the limiting assembly 38 of the first clamping member 32 onto the second clamping member 34, or separating the two from each other, thereby adjusting the distance between the first clamping part 3233 and the second clamping part 343, and the holding mechanism 30 can be applied to displaying device of different sizes.

It is understood that the second elastic member 387 can be an elastic member of another structure, for example, a torsional spring, a coil spring, an elastic plate, an elastic sleeve, etc., and one end of the second elastic member 387 abuts against the first clamping member 32 and the other end abuts against the pressing member 385 to provide a restoring force of movement to the limiter 383.

It is understood that the second elastic member 387 can be omitted and the limiter 383 may be designed with an elastic structure, and when an external force is applied, the limiter can be snapped with or separated from the limiting part 3411. Alternatively, the limiter 383 as a whole is arranged on the second housing 323 and can be a pluggable structure, and the stopping part 3835 on the limiter 383 is snapped with or separated from the limiting part 3411 by inserting the limiter 383 into the second housing 323, or pulling the limiter out from the second housing 323.

It is understood that the fastening assembly 16 can be omitted, and when assembling the bracket 100, the holding mechanism 30 may be fastened on the seat 10 via a screw.

It is understood that the number of snap-fitting parts 1657 can be one or more, and accordingly, the numbers of the snapping part 1637 and the sliding groove 1638 can also be one or more. When the numbers of the snap-fitting part 1657, the snapping part 1637 and the sliding groove 1638 are more than one, the plurality of snap-fitting parts 1657 are formed on the inner wall of the first sheathing hole 1651 separate from each other with a spacing in between, and the plurality of snapping parts 1637 are formed on the mating part 1635 separate from each other and is in a one-to-one correspondence relationship with the plurality of snap-fitting parts 1657. The plurality of sliding grooves 1638, in a one-to-one correspondence relationship with the plurality of snapping parts 1637, are formed on the fastening member 163 and are in communication with the corresponding snapping parts 1637.

The foregoing disclosure is merely illustrative of the embodiments of the disclosure but not intended to limit the scope of the disclosure. Any equivalent modifications to a structure or process flow, which are made without departing from the specification and the drawings of the disclosure, and a direct or indirect application in other relevant technical fields, shall also fall into the scope of the disclosure.

What is claimed is:

1. A fastening assembly comprising:
 a fastening member including a threaded part and a mating part connected to the threaded part, the mating part including a snapping part at an end of the mating part that is distal from the threaded part, wherein the snapping part includes a slot extending along a circumferential direction of the mating part; and
 an operating member movably sheathed on the fastening member, the operating member including a snap-fitting part corresponding to the mating part, the snap-fitting part including a snapping protrusion,
 wherein the operating member is configured to slide along an axial direction of the operating member relative to the fastening member to snap the snap-fitting part with the snapping part or to separate the snap-fitting part from the snapping part.

2. The fastening assembly of claim 1, wherein the operating member is configured to drive the fastening member to rotate via the snap-fitting part.

3. The fastening assembly of claim 1, further comprising:
 a resetting member configured to provide an elastic restoring force to the operating member to enable the operating member to automatically reset after sliding.

4. The fastening assembly of claim 3, wherein the resetting member is accommodated in the operating member, and a first end of the resetting member abuts against the fastening member and a second end of the resetting member abuts against the operating member.

5. The fastening assembly of claim 4, wherein:
 the operating member includes a first sheathing hole and a second sheathing hole arranged along the axial direction of the operating member, the first sheathing hole and second sheathing hole being in communication with each other and together penetrating the entire operating member;
 a size of the first sheathing hole is smaller than a size of the second sheathing hole, such that a stepped surface is formed at a position where the first sheathing hole and second sheathing hole are connected; and
 the second end of the resetting member abuts against the stepped surface.

6. The fastening assembly of claim 5, wherein:
 the fastening member further includes a flange part formed at an end of the mating part that is distal from the threaded part; and
 the resetting member is sheathed on the mating part and abuts between the stepped surface and the flange part.

7. The fastening assembly of claim 1, wherein:
 a diameter of the threaded part is smaller than a diameter of the mating part;
 the mating part includes a sliding groove along an axial direction of the mating part, one end of the sliding groove penetrating to the threaded part and another end of the sliding groove being in communication with the snapping part; and the snap-fitting part is configured to slide along the sliding groove into the snapping part.

8. The fastening assembly of claim 1, further comprising:
a locking member configured to be coupled to the threaded part in a threaded fit.

9. A mounting bracket comprising:
a connecting frame;
a holding mechanism configured to hold an external device; and
a fastening assembly configured to adjust a mounting position of the holding mechanism relative to the connecting frame, the fastening assembly including:
a fastening member including a threaded part and a mating part connected to the threaded part;
an operating member movably sheathed on the fastening member, the operating member including a snap-fitting part corresponding to the mating part; and
a resetting member configured to provide an elastic restoring force to the operating member to enable the operating member to automatically reset after sliding.

10. The mounting bracket of claim 9, wherein the operating member is configured to slide along an axial direction of the operating member relative to the fastening member to snap-fit the snap-fitting part with the mating part, such that the operating member drives the fastening member to rotate via the snap-fitting part.

11. The mounting bracket of claim 9, wherein the resetting member is accommodated in the operating member, and a first end of the resetting member abuts against the fastening member and a second end of the resetting member abuts against the operating member.

12. The mounting bracket of claim 11, wherein:
the operating member includes a first sheathing hole and a second sheathing hole arranged along the axial direction of the operating member, the first sheathing hole and second sheathing hole being in communication with each other and together penetrating the entire operating member;
a size of the first sheathing hole is smaller than a size of the second sheathing hole, such that a stepped surface is formed at a position where the first sheathing hole and second sheathing hole are connected; and
the second end of the resetting member abuts against the stepped surface.

13. The mounting bracket of claim 12, wherein:
the fastening member further includes a flange part formed at an end of the mating part that is distal from the threaded part; and
the resetting member is sheathed on the mating part and abuts between the stepped surface and the flange part.

14. The mounting bracket of claim 9, wherein:
the snap-fitting part includes a snapping protrusion;
the mating part includes a snapping part at an end of the mating part that is distal from the threaded part; and
the operating member is configured to slide along an axial direction of the operating member relative to the fastening member to snap the snap-fitting part with the snapping part or to separate the snap-fitting part from the snapping part.

15. The mounting bracket of claim 14, wherein the snapping part includes a slot extending along a circumferential direction of the mating part.

16. The mounting bracket of claim 15, wherein:
a diameter of the threaded part is smaller than a diameter of the mating part;
the mating part includes a sliding groove along an axial direction of the mating part, one end of the sliding groove penetrating to the threaded part and another end of the sliding groove being in communication with the snapping part; and
the snap-fitting part is configured to slide along the sliding groove into the snapping part.

17. The mounting bracket of claim 9, wherein the fastening assembly further includes a locking member configured to be coupled to the threaded part in a threaded fit.

* * * * *